US011025264B2

(12) United States Patent
Balboni et al.

(10) Patent No.: US 11,025,264 B2
(45) Date of Patent: Jun. 1, 2021

(54) DISTRIBUTED ADC FOR ENHANCED BANDWIDTH AND DYNAMIC RANGE

(71) Applicant: Analog Devices, Inc., Norwood, MA (US)

(72) Inventors: Ed Balboni, Littleton, MA (US); Frank Murden, Roan Mountain, TN (US); Peter Delos, Greensboro, NC (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/749,965

(22) Filed: Jan. 22, 2020

(65) Prior Publication Data

US 2020/0244279 A1 Jul. 30, 2020

Related U.S. Application Data

(60) Provisional application No. 62/796,445, filed on Jan. 24, 2019.

(51) Int. Cl.
*H03M 1/00* (2006.01)
*H03M 1/12* (2006.01)
*H03K 5/14* (2014.01)

(52) U.S. Cl.
CPC ............ *H03M 1/1245* (2013.01); *H03K 5/14* (2013.01)

(58) Field of Classification Search
CPC ... H03M 1/1245; H03M 1/1265; H03M 1/126
USPC .................................................. 341/155, 141
See application file for complete search history.

(56) References Cited

U.S. PATENT DOCUMENTS

| 3,810,126 | A | 5/1974 | Butler et al. | |
|---|---|---|---|---|
| 4,117,409 | A | 9/1978 | O'Brien | |
| 4,825,103 | A | 4/1989 | Hornak | |
| 5,451,955 | A * | 9/1995 | Sullivan | H03M 1/164 341/155 |
| 5,471,162 | A | 11/1995 | McEwan | |
| 6,570,411 | B1 | 5/2003 | Bardsley et al. | |
| 8,269,660 | B2 * | 9/2012 | Van Veldhoven | H03M 1/502 341/155 |

(Continued)

FOREIGN PATENT DOCUMENTS

| EP | 3 104 181 | 12/2016 |
|---|---|---|
| EP | 3 113 367 | 1/2017 |

(Continued)

OTHER PUBLICATIONS

Requirement for Restriction/Election issued in U.S. Appl. No. 15/896,355 dated Apr. 22, 2019, 5 pages.

(Continued)

*Primary Examiner* — Peguy Jean Pierre
(74) *Attorney, Agent, or Firm* — Patent Capital Group

(57) ABSTRACT

An ultra-wideband distributed ADC can be cascaded to build high performance radio frequency (RF) analog electronics integrated with advanced digital complementary metal-oxide-semiconductor (CMOS) electronics on the same wafer. Advantages can include wide spectral coverage, high resolution, large dynamic range, and high information processing bandwidth. Part of an overall system includes a precise, programmable, real-time delay circuit that can achieve picosecond accuracy.

27 Claims, 6 Drawing Sheets

(56) References Cited

U.S. PATENT DOCUMENTS

| | | |
|---|---|---|
| 9,800,228 B2 | 10/2017 | Hidri |
| 2005/0132399 A1 | 6/2005 | Smith |
| 2009/0115650 A1* | 5/2009 | Tietjen ............... H04B 1/0007 |
| | | 341/141 |
| 2016/0020778 A1 | 1/2016 | Bogner et al. |
| 2017/0005640 A1 | 1/2017 | Hidri |
| 2019/0253286 A1 | 8/2019 | Shibata et al. |

FOREIGN PATENT DOCUMENTS

| | | |
|---|---|---|
| WO | 94/06121 | 3/1994 |
| WO | 2019/158441 | 8/2019 |

OTHER PUBLICATIONS

Non-Final OA dated Aug. 2, 2019.
Notice of Allowance dated Nov. 20, 2019.
International Search Report and Written Opinion in PCT/EP19/053135 dated Apr. 23, 2019, 16 pages.
Gabriele Manganaro, "3.2.3—Time-to-digital and digital-to-time converters", 3.2 Emerging Architectures and Techniques, Nov. 17, 2011, Cambridge University Press, 13 pages.
Grave et al., *Spatially Interleaved Architecture for High-Frequency Data Converters*, 978-1-4799-5341-7/16 © 2016 IEEE, 4 pages.
Wikipedia, *Analog Delay Line*, Apr. 12, 2019, 4 pages.

\* cited by examiner

DISTRIBUTED ADC FOR ENHANCED BANDWIDTH AND DYNAMIC RANGE

PRIORITY DATA

This application is a Non-Provisional application of U.S. Provisional Patent Application 62/796,445 (filed on Jan. 24, 2019, and entitled "DISTRIBUTED ADC FOR ENHANCED BANDWIDTH AND DYNAMIC RANGE"), which is hereby incorporated by reference in its entirety.

TECHNICAL FIELD OF THE DISCLOSURE

The present disclosure relates generally to analog circuits, and, more particularly, to analog to digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog to digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature, or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost, and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Designing ADCs

Figure 1:
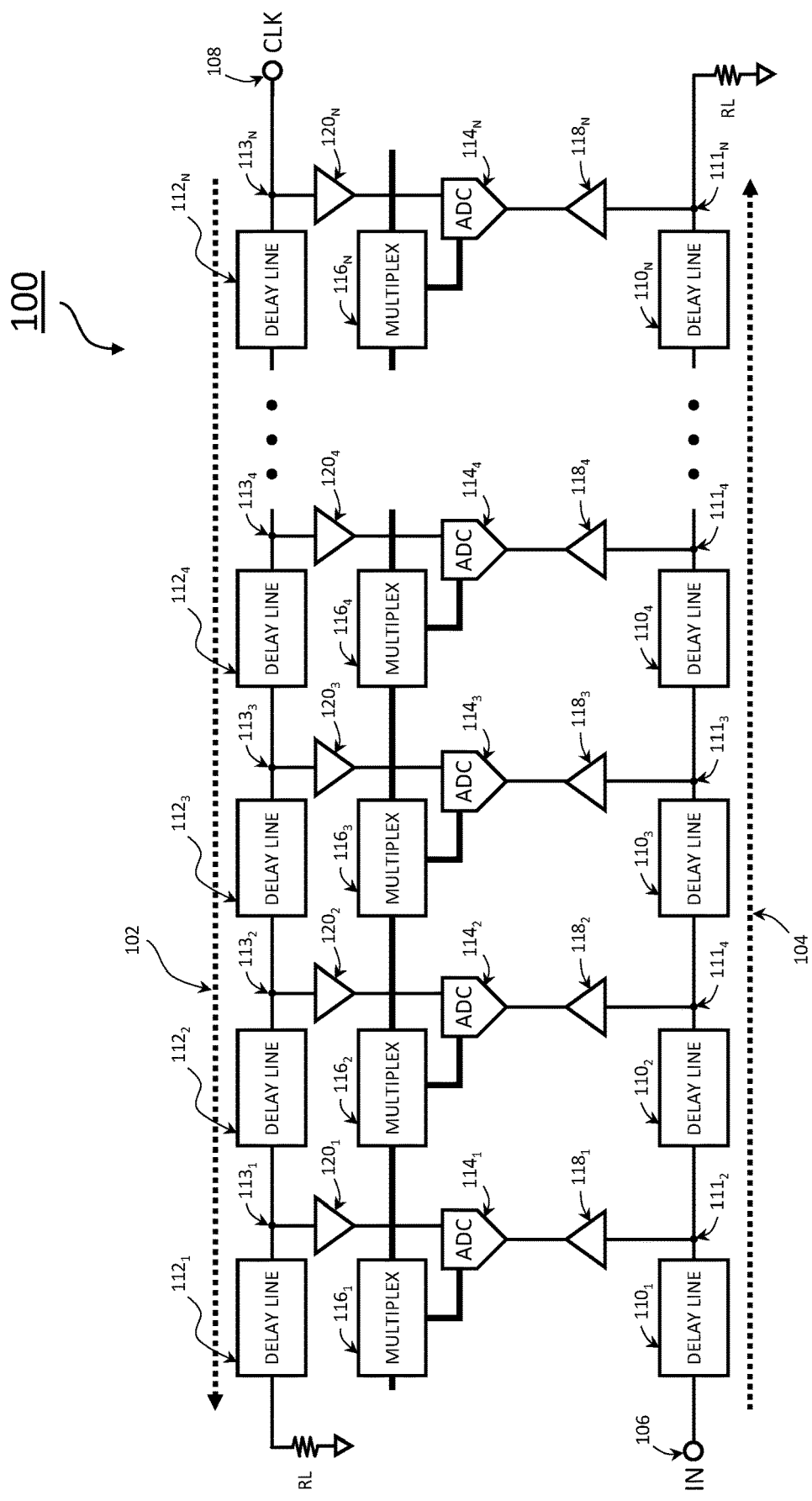
FIG. 1 illustrates a distributed ADC that can increase bandwidth and sample rate, according to some embodiments of the disclosure.

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time (CT) and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Overview of Distributed ADC Architecture

An ultra-wideband distributed ADC can be cascaded to build high performance radio frequency (RF) analog electronics integrated with advanced digital complementary metal-oxide-semiconductor (CMOS) electronics on the same wafer. Advantages can include wide spectral coverage, high resolution, large dynamic range, and high information processing bandwidth.

Part of an overall distributed ADC architecture includes a precise, programmable, real-time delay circuit that can achieve picosecond accuracy. The delay circuit can be fabricated using an advanced mixed-mode technologies with high speed low noise RF analog transistors co-integrated at wafer scale with embedded advanced digital CMOS electronics (e.g., 22 nm) on the same wafer. This delay circuit can be integrated into a wideband RF front-end on the process. The custom RF front-end can drive an ADC, e.g., an ADC bumped die.

The picosecond programmable, real-time delay function in a distributed ADC architecture can include a second-order of adaptability that can be exploited for advanced features such as real-time adaptive processing for interference cancellation and operation in congested spectrum.

Ultra-High Speed RF Front-End: Transmission Lines Architecture

In recent years, ADCs' bandwidth has increased into the giga-Hertz (GHz) range. It has become increasingly more difficult to drive the ADC load, which results in a bandwidth bottleneck. In one technique, it is possible to use transmission lines as part of an RF front-end for an ADC to improve bandwidth. In another technique, some architectures leveraging transmission lines can increase ADC dynamic range. The two techniques can then combined to increase ADC bandwidth and dynamic range resulting in a scalable ADC architecture with both high bandwidth and high dynamic range.

FIG. 1 illustrates a distributed ADC 100 that can increase bandwidth and sample rate, according to some embodiments of the disclosure. The distributed ADC can include a plurality of ADC slices $114_1$, $114_2$, $114_3$, $114_4$, . . . $114_N$. The ADC slices are shown as "ADC" in the FIGURE. N is a number of ADC slices in the distributed ADC 100, and N is greater than or equal to two. Preferably, N is a higher number such as 4, 8, 16, 32, and so on.

The input signal "IN" enters at the bottom left (node 106) and the input signal progresses/propagates through delay lines $110_1$, $110_2$, $110_3$, $110_4$, . . . $110_N$ (or delay blocks) toward the right. The delay lines $110_1$, $110_2$, $110_3$, $110_4$, . . . $110_N$ are shown as "DELAY LINE" in the FIGURE, and form the input signal path. The delay lines $110_1$, $110_2$, $110_3$, $110_4$, . . . $110_N$ are serially-connected in a cascaded manner. In between the delay lines $110_1$, $110_2$, $110_3$, $110_4$, . . . $110_N$ are nodes $111_1$, $111_2$, $111_3$, $111_4$, . . . $111_N$. Delayed versions of the input signal are present at the nodes $111_1$, $111_2$, $111_3$, $111_4$, . . . $111_N$. Optionally, the delayed versions of the input signal are buffered by corresponding buffers $118_1$, $118_2$, $118_3$, $118_4$, . . . $118_N$. The delayed versions of the input signal are provided as input to corresponding ADC slices $114_1$, $114_2$, $114_3$, $114_4$, . . . $114_N$.

The clock signal "CLK" enters at the upper right (node 108) and progresses/propagates through delay lines $112_1$, $112_2$, $112_3$, $112_4$, . . . $112_N$ (or delay blocks) to the left. The delay lines $112_1$, $112_2$, $112_3$, $112_4$, . . . $112_N$ are shown as "DELAY LINE" in the FIGURE, and form the clock signal path. The delay lines $112_1$, $112_2$, $112_3$, $112_4$, . . . $112_N$ are serially-connected in a cascaded manner. In between the delay lines $112_1$, $112_2$, $112_3$, $112_4$, . . . $112_N$ are nodes $113_1$, $113_2$, $113_3$, $113_4$, . . . $113_N$. Delayed versions of the clock signal are present at the nodes $113_1$, $113_2$, $113_3$, $113_4$, . . . $113_N$. Optionally, the delayed versions of the clock signal are buffered by corresponding buffers $120_1$, $120_2$, $120_3$, $120_4$, . . . $120_N$. The delayed versions of the clock signal clock or control corresponding ADC slices $114_1$, $114_2$, $114_3$, $114_4$, . . . $114_N$.

The delay lines for the clock signal path and the input signal path can be programmable. For instance, the amount of delay provided by a given delay line can be programmable. In another instance, a frequency response of the delay line can be programmable.

Arrow 102 shows the direction of signal propagation of the clock signal path. Arrow 104 shows the direction of signal propagation of the input signal path. The propagation directions of the clock signal path and the input signal path are opposite of each other.

By appropriately setting the programmable delay lines or programmable delay blocks (shown as "DELAY LINE" in the FIGURE) in the clock signal path and input signal path, the signal sampled by each ADC slice is delayed in time. By appropriately adjusting and setting the delay lines or delay blocks, the input signal can be uniformly sampled at a higher rate, by the distributed ADC 100, than that of each ADC slice, e.g., at an effective sampling rate that is N times higher than that of each ADC slice. Phrased differently, the samples of the input signal are distributed to the ADC slices $114_1$, $114_2$, $114_3$, $114_4$, . . . $114_N$ through the delay lines, where each ADC slice is processing and quantizing a different sample of the input signal, in parallel. Accordingly, the ADC slices $114_1$, $114_2$, $114_3$, $114_4$, . . . $114_N$ are time-interleaved ADC slices, i.e., effectively operating in a time-interleaved manner.

When the outputs of the ADC slices are $114_1$, $114_2$, $114_3$, $114_4$, . . . $114_N$ multiplexed or combined together, by the corresponding multiplex blocks $116_1$, $116_2$, $116_3$, $116_4$, . . . $116_N$ (shown as "MULTIPLEX" in the FIGURE), the result is a distributed ADC 100 that can process uniformly time-sampled input (e.g., sampled at N times the sample rate of each ADC slice), and generate a digital output representative of the input signal. The multiplex blocks $116_1$, $116_2$, $116_3$, $116_4$, . . . $116_N$ can assemble the outputs of the ADC slices in a consistent order to generate a stream of digital output codes as the digital output. The multiplex blocks $116_1$, $116_2$, $116_3$, $116_4$, . . . $116_N$ can be implemented digitally.

In addition, the input and clock loads can be absorbed into the transmission line impedance, resulting in an increase in bandwidth.

Figure 2:
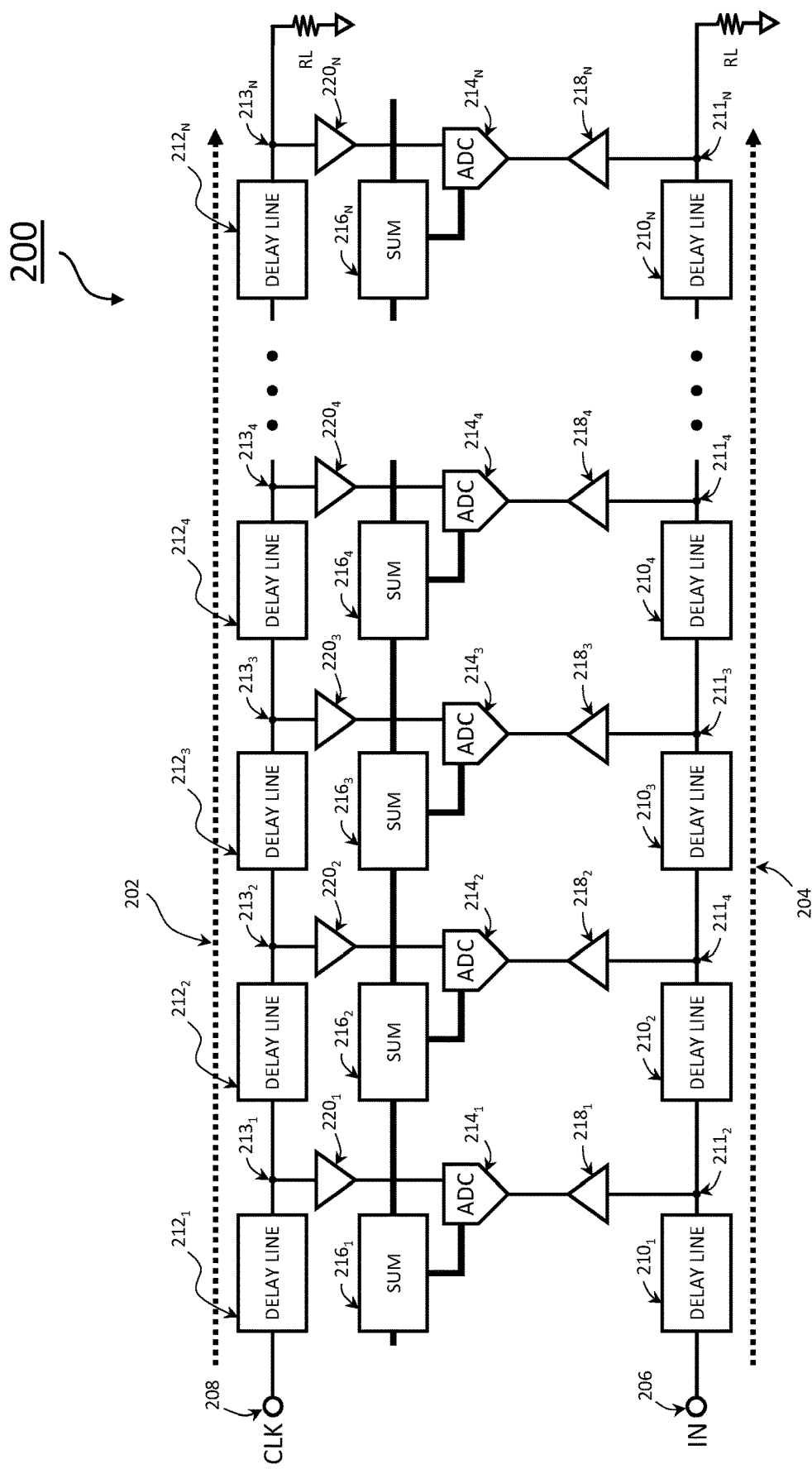
FIG. 2 illustrates a distributed ADC that can increase bandwidth and dynamic range, according to some embodiments of the disclosure.

FIG. 2 illustrates a distributed ADC 200 that can increase bandwidth and dynamic range, according to some embodiments of the disclosure. The distributed ADC can include a plurality of ADC slices $214_1$, $214_2$, $214_3$, $214_4$, . . . $214_N$. The ADC slices are shown as "ADC" in the FIGURE. N is a number of ADC slices in the distributed ADC 200, and N is greater than or equal to two. Preferably, N is a higher number such as 4, 8, 16, 32, and so on.

Both the clock signal "CLK" and the input signal "IN" enter on the left, at node 208 and node 206 respectively, and progress/propagate through delay lines or delay blocks (shown as "DELAY LINE" in the FIGURE) toward the right. Arrow 202 shows the direction of signal propagation of the clock signal path. Arrow 204 shows the direction of signal propagation of the input signal path. The propagation directions of the clock signal path and the input signal path are the same.

The input signal "IN" enters at the bottom left (node 206) and the input signal progresses/propagates through delay lines $210_1$, $210_2$, $210_3$, $210_4$, . . . $210_N$ (or delay blocks) toward the right. The delay lines $210_1$, $210_2$, $210_3$, $210_4$, . . . $210_N$ are shown as "DELAY LINE" in the FIGURE. The delay lines $210_1$, $210_2$, $210_3$, $210_4$, . . . $210_N$ are serially-connected in a cascaded manner. In between the delay lines $210_1$, $210_2$, $210_3$, $210_4$, . . . $210_N$ are nodes $211_1$, $211_2$, $211_3$, $211_4$, . . . $211_N$. Delayed versions of the input signal are present at the nodes $211_1$, $211_2$, $211_3$, $211_4$, . . . $211_N$. Optionally, the delayed versions of the input signal are buffered by corresponding buffers $218_1$, $218_2$, $218_3$, $218_4$, . . . $218_N$. The delayed versions of the input signal are provided as input to corresponding ADC slices $214_1$, $214_2$, $214_3$, $214_4$, . . . $214_N$.

The clock signal "CLK" enters at the upper left (node 208) and progresses/propagates through delay lines $212_1$, $212_2$, $212_3$, $212_4$, . . . $212_N$ (or delay blocks) to the right. The delay lines $212_1$, $212_2$, $212_3$, $212_4$, . . . $212_N$ are shown as "DELAY LINE" in the FIGURE. The delay lines $212_1$, $212_2$, $212_3$, $212_4$, . . . $212_N$ are serially-connected in a cascaded manner. In between the delay lines $212_1$, $212_2$, $212_3$, $212_4$, . . . $212_N$ are nodes $213_1$, $213_2$, $213_3$, $213_4$, . . . $213_N$. Delayed versions of the clock signal are present at the nodes $213_1$, $213_2$, $213_3$, $213_4$, . . . $213_N$. Optionally, the delayed versions of the clock signal are buffered by corresponding buffers $220_1$, $220_2$, $220_3$, $220_4$, . . . $220_N$. The delayed versions of the clock signal clock or control corresponding ADC slices $214_1$, $214_2$, $214_3$, $214_4$, . . . $214_N$.

The delay lines for the clock signal path and the input signal path can be programmable. For instance, the amount of delay provided by a given delay line can be programmable. In another instance, a frequency response of the delay line can be programmable.

With the delay lines or delay blocks in the clock signal path and input signal path set to the same value (e.g., same amount of delay), the clock signal and input signals can arrive at each ADC slice at the same time. Thus, the ADC slices are sampling the same instant of the input signal. In other words, a same sample of the input signal is distributed to the ADC slices $214_1$, $214_2$, $214_3$, $214_4$, ... $214_N$ through the delay lines, where each ADC slice is processing and quantizing a same sample of the input signal, in parallel.

Each ADC slice can produce uncorrelated noise. When the digital outputs of ADC slices $214_1$, $214_2$, $214_3$, $214_4$, ... $214_N$ are summed together, by the summing blocks $216_1$, $216_2$, $216_3$, $216_4$, ... $216_N$ (shown as "SUM" in the FIGURE), the result is a distributed ADC 200 that can sum or add digital outputs arithmetically while the uncorrelated noise sources add incoherently (e.g., uncorrelated distortion can sum in a root mean squared (RMS) fashion while the signal can sum proportionally). The distributed ADC 200 can have an improved dynamic range compared to an individual ADC slice by 10*log(N) where N is the number of ADC slices used. The summing blocks $216_1$, $216_2$, $216_3$, $216_4$, ... $216_N$ can be implemented digitally.

Additionally, the delay lines or delay blocks can absorb the input impedance of the distributed ADC input and clocks from each ADC slice.

In some cases, the digital outputs of the ADC slices $214_1$, $214_2$, $214_3$, $214_4$, ... $214_N$ are averaged to improve dynamic range.

FIGS. 1 and 2 illustrate that distributed ADC slices can improve overall performance dramatically. Depending on how the clock signal is delayed relative to the input signal one of the two techniques can be used to increase the dynamic range or increase the bandwidth. When the two techniques illustrated in FIGS. 1 and 2 are combined together, the final distributed ADC can increase sample rate, dynamic range, and bandwidth.

Figure 3:
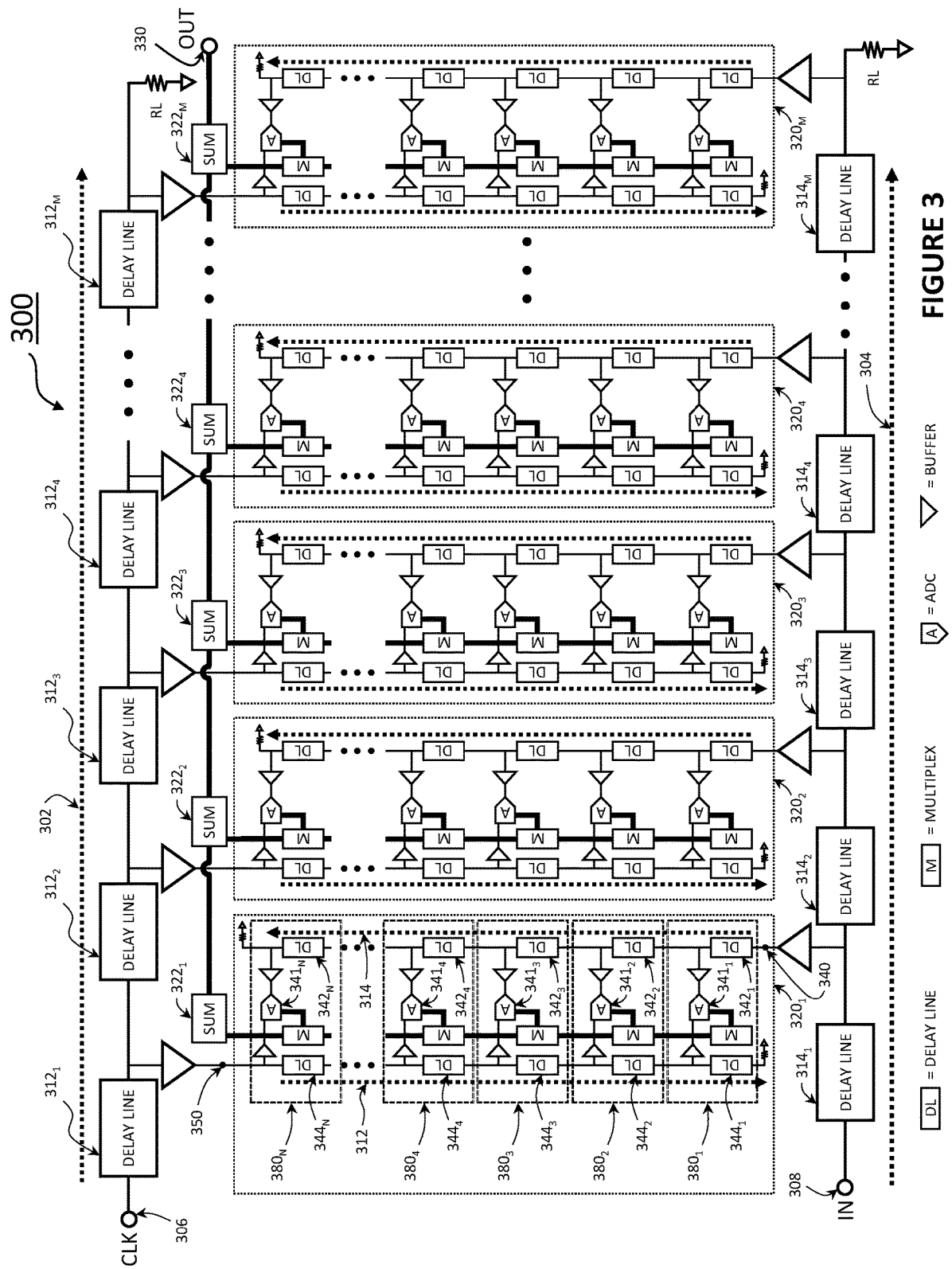
FIG. 3 illustrates a distributed ADC that can increase bandwidth, dynamic range, and sample rate, according to some embodiments of the disclosure.

FIG. 3 illustrates a distributed ADC 300 that can increase bandwidth, dynamic range, and sample rate, according to some embodiments of the disclosure. In the illustrative example, the distributed ADC 300 embeds the architecture seen in FIG. 1 within the architecture seen in FIG. 2. Specifically, the ADC slices $214_1$, $214_2$, $214_3$, $214_4$, ... $214_N$ seen in FIG. 2 (shown as "ADC") are each replaced with the higher rate/bandwidth distributed ADC 100 shown in FIG. 1. The architecture seen in FIG. 2 serves as the primary architecture, while the architecture seen in FIG. 1 serves as the secondary architecture nested within the primary architecture.

Same as in FIG. 2, both the clock signal "CLK" and the input signal "IN" of distributed ADC 300 enter on the left (at node 306 and node 308 respectively), and progress/propagate through delay lines or delay blocks (shown as "DELAY LINE" in the FIGURE) of the primary clock signal path and the primary input signal path, respectively, toward the right. Arrow 302 shows the direction of signal propagation of a primary clock signal path formed from a first series of delay lines. Arrow 304 shows the direction of signal propagation of a primary input signal path formed from a second series of delay lines. The propagation directions of the primary clock path and the primary input signal path are the same (consistent with the architecture illustrated in FIG. 2).

The primary clock signal path comprises M serially-connected delay lines $312_1$, $312_2$, $312_3$, $312_4$, ... $312_M$ (or delay blocks). M is greater than or equal to 2. Preferably, M can be equal to 4, 8, 16, 32, and so on. The primary input signal path comprises M serially-connected delay lines $314_1$, $314_2$, $314_3$, $314_4$, ... $314_M$ (or delay blocks). The functionalities and features of the primary clock signal path and primary input signal path are the same as the functionalities and features of the clock signal path and the input signal path illustrated in FIG. 2.

As shown in FIG. 3, the distributed ADC 300 has M primary ADC slices $320_1$, $320_2$, $320_3$, $320$, ... $320_N$. Accordingly, the primary clock path and the primary input signal path can drive M number of primary ADC slices $320_1$, $320_2$, $320_3$, $320$, ... $320_N$. The digital outputs of the M primary slices $320_1$, $320_2$, $320_3$, $320$, ... $320_N$ are summed, by M summing blocks $322_1$, $322_2$, $322_3$, $322_4$, ... $322_M$ (shown as "SUM" in the FIGURE), to improve dynamic range and increase bandwidth. The summing blocks $322_1$, $322_2$, $322_3$, $322_4$, ... $322_M$ generate the final digital output "OUT" of the distributed ADC 300 at node 330. The summing blocks $322_1$, $322_2$, $322_3$, $322_4$, ... $322_M$ operate similarly or in the same fashion as the summing blocks $216_1$, $216_2$, $216_3$, $216_4$, ... $216_N$ illustrated in FIG. 2.

Each one of the primary ADC slices $320_1$, $320_2$, $320_3$, $320_4$, ... $320_M$ are implemented in the same manner as the distributed ADC 100 of FIG. 1. Specifically, each one of the primary ADC slices $320_1$, $320_2$, $320_3$, $320_4$, ... $320_M$ can be implemented as a distributed ADC having N secondary ADC slices $341_1$, $341_2$, $341_3$, $341_4$, ... $341_N$, in accordance with the architecture illustrated in FIG. 1. N is greater than or equal to 2. Preferably, N can be equal to 4, 8, 16, 32, and so on.

To illustrate, details within the primary ADC slice $320_1$ is described in greater detail. Primary ADC slice $320_1$, comprises N secondary ADC slices $341_1$, $341_2$, $341_3$, $341_4$, ... $341_N$. Within primary ADC slice $320_1$, the input signal "IN" enters from the bottom at node 340, and the input signal progresses/propagates through N delay lines $342_1$, $342_2$, $342_3$, $342_4$, ... $342_N$ or delay blocks (shown as "DL" in the FIGURE) toward the top. N delay lines $342_1$, $342_2$, $342_3$, $342_4$, ... $342_N$ thus forms the secondary input signal path. Also, within primary ADC slice $320_1$, the clock signal "CLK" enters from the top at node 350 and progresses/propagates through N delay lines $344_1$, $344_2$, $344_3$, $344_4$, ... $344_N$ or delay blocks toward the bottom. N delay lines $344_1$, $344_2$, $344_3$, $344_4$, ... $344_N$ thus forms the secondary clock signal path.

Arrow 312 shows the direction of signal propagation of a secondary clock signal path within primary slice $320_1$. Arrow 314 shows the direction of signal propagation of the secondary input signal path within primary slice $320_1$. The functionalities and features of the secondary clock signal path and secondary input signal path are the same as the functionalities and features of the clock signal path and the input signal path illustrated in FIG. 1. The propagation directions of the secondary clock signal path and the secondary input signal path are opposite of each other. Setting the programmable delay lines or programmable delay blocks (shown as "DL" in the FIGURE) in the secondary clock signal path and secondary input signal path, the signal sampled by each one of the secondary ADC slices $341_1$, $341_2$, $341_3$, $341_4$, ... $341_N$ is delayed in time. The outputs of the secondary ADC slices $341_1$, $341_2$, $341_3$, $341_4$, ... $341_N$ are multiplexed to increase sample rate and increase bandwidth.

As a result, the distributed ADC 300 of FIG. 3 can include M×N number of ADC slices.

It is envisioned by the disclosure that the architecture seen in FIG. 1 can serve as the primary architecture, while the architecture seen in FIG. 2 serves as the secondary architecture nested within the primary architecture.

In some embodiments, the secondary ADC slices $341_1$, $341_2$, $341_3$, $341_4$, ... $341_N$ can each further include K tertiary ADC slices. K is greater than or equal to 2. Preferably, K can be equal to 4, 8, 16, 32, and so on. In one instance, a given secondary ADC slice can be implemented based on the architecture of the distributed ADC seen in FIG. 1 having K tertiary ADC slices. In another instance, a given second ADC slice can be implemented based on the architecture of the distributed ADC seen in FIG. 2 having K tertiary ADC slices.

In some embodiments, a tertiary ADC slice can include L quaternary ADC slices. L is greater than or equal to 2. Preferably, L can be equal to 4, 8, 16, 32, and so on. In one instance, a given tertiary ADC slice can be implemented based on the architecture of the distributed ADC seen in FIG. 1 having L quaternary ADC slices. In another instance, a given tertiary ADC slice can be implemented based on the architecture of the distributed ADC seen in FIG. 2 having L quaternary ADC slices.

Effect of Using Transmission Lines

Wiring the inputs of many ADC slices together can increase the input capacitance, which can limit the input bandwidth. This effect can be mitigated by distributing the ADC slices using transmission lines and/or artificial transmission lines in both the input signal path and clock signal path, as seen in FIGS. 1-3.

If both the clock and input signal are delayed by the same amount, then each ADC slice would effectively sample the signal at the same time or instant, as illustrated in FIG. 2. When summed (averaged) the resulting uncorrelated noise and uncorrelated distortion can sum in a RMS fashion while the signal can sum proportionally. The dynamic range can then be improved by $10*\log(N)$ when N is the number of ADCs. The noise floor can be lowered, and clock noise can be reduced.

If instead of delaying the input signal by the same amount as the clock signal, the clock signal is delayed relative to the input signal, then each ADC slice would sample a time delayed version of the signal, as illustrated in FIG. 1. By carefully adjusting the relative delays relative to a sampling period, the outputs can be multiplexed to generate a final output signal, resulting in a higher effective sampling rate.

The above two techniques can be used together to effectively increase both sample rate, bandwidth, and dynamic range. This combined approach can ease challenges in driving many ADCs and can be less sensitive to error sources.

Distributed ADC Slice: A Scalable Building Block of a Distributed ADC

The distributed ADC architecture, as illustrated by FIGS. 1-3, is highly scalable. FIG. 3 illustrates that the distributed ADC 300 is implemented based on a nested, scalable architecture. As illustrated by FIG. 3, a primary distributed ADC can be implemented according to the architecture illustrated in FIG. 2 using M primary building blocks, and each primary building block can have N secondary building blocks (e.g., $380_1$, $380_2$, $380_3$, $380_4$, . . . $380_N$ building blocks seen in FIG. 3).

Figure 4:
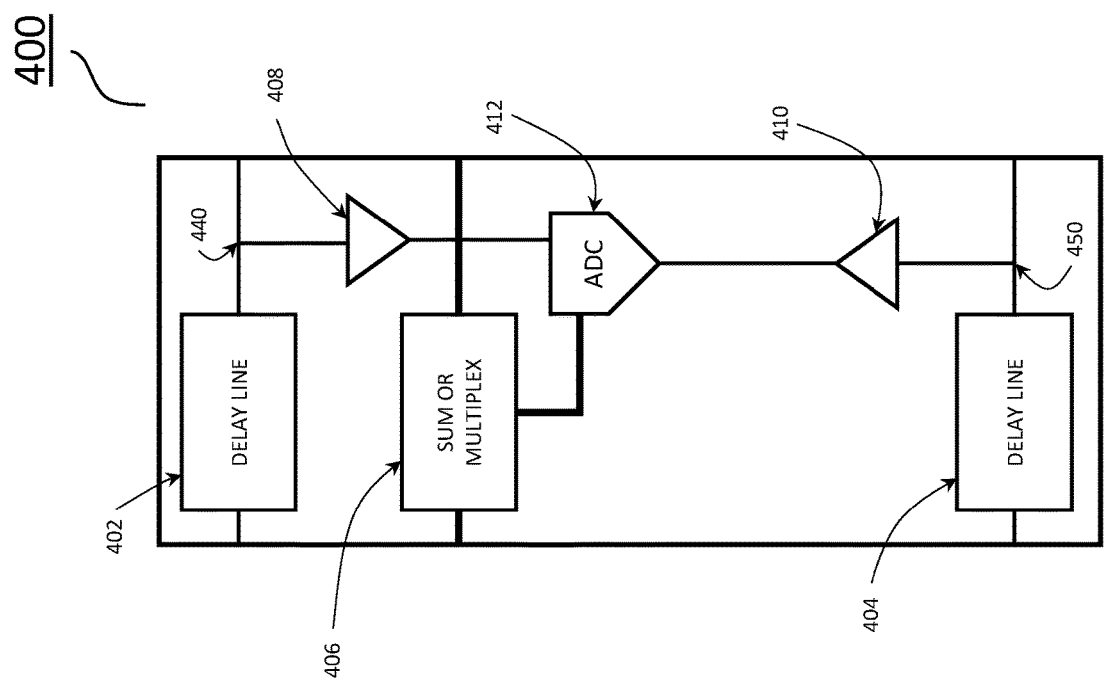
FIG. 4 illustrates an exemplary building block of a distributed ADC, according to some embodiments of the disclosure.

FIG. 4 illustrates an exemplary building block of a distributed ADC, according to some embodiments of the disclosure. A building block 400 can include a delay line 402 for delaying a clock signal, a delay line 404 for delaying an input signal, an ADC slice 412, a summing or multiplex block 406 (shown as "SUM OR MULTIPLEX" in the FIGURE) at the output of the ADC slice 412. ADC slice is a term herein used to describe circuitry that can quantize an analog input signal and generate a digital output. Depending on the distributed ADC architecture, block 406 can perform summing or multiplexing. The building block 400 can include optional buffer/amplifier 408 for buffering/amplifying a delayed clock signal present at node 440, and optional buffer/amplifier 410 for buffering/amplifying a delayed input signal present at node 450. The buffer/amplifier 408 and/or the buffer/amplifier 410 can implement gain adjustment to accommodate for attenuation (line loss) of the clock/input signal as it propagates through delay lines.

In some embodiments, delay line 402 and/or delay line 404 can be implemented as one or more of the following: a transmission line, resistor-capacitor lattice, cascaded resistor-capacitor lattices, inductor-capacitor lattice, and cascaded inductor-capacitor lattices. Resistor-capacitor lattice, cascade resistor-capacitor lattices, inductor-capacitor lattice, and cascaded inductor-capacitor lattices can be considered as artificial transmission lines.

In some embodiments, any one or more of delay line 402, delay line 404 is programmable. The delay and/or frequency response of any one or more of delay line 402, delay line 404 can be varied for a given application and/or over time. The delay and/or frequency response of any one or more of delay line 402, delay line 404 can be varied in response to one or more control inputs. The delay and/or frequency response of any one or more of delay line 402, delay line 404 can be trimmed and/or calibrated.

In some embodiments, any one or more of buffer/amplifier 408 and buffer/amplifier 410 is programmable. The gain of one or more of buffer/amplifier 408 and buffer/amplifier 410 can be varied.

In some embodiments, many delay lines (such as delay line 404) in cascaded building blocks delaying the input signal can be implemented as a multi-tap finite impulse response (FIR) filter to provide a filtering effect. Specifically, gains of the delay lines can be programmed to implement the multi-tap FIR filter.

The summing or multiplex block 406 can be implemented by one or more of the following: digital circuitry and/or a processor. The digital circuitry and/or the processor can be on-chip with the ADC slice 412.

The ADC slice 412 within a building block can include one ADC slice, or in some cases, a plurality of ADC slices. ADC slice 412 can be implemented based on a variety of ADC architectures, including but not limited to, the architectures illustrated in FIGS. 1-3.

Many building blocks, such as the building block shown in FIG. 4, can be cascaded to increase high sampling rates and/or dynamic range, depending on whether the propagation directions of the clock signal path and the input signal path or opposite of each other or the same.

More broadly speaking, a primary distributed ADC can be implemented according to a distributed ADC architecture according to FIG. 1 or FIG. 2, and the primary distributed ADC can have M primary building blocks. An ADC slice within a primary building block of the primary distributed ADC can be implemented as a secondary distributed ADC, and the second distributed ADC can have N secondary building blocks. The secondary distributed ADC can be can be implemented according to a distributed ADC architecture according to FIG. 1 or FIG. 2.

The number of building blocks at different layers of the nested, scalable distributed ADC architecture can be chosen or selected for a given application and desired performance. The architecture for a given distributed ADC at a given layer of the nested, scalable distributed ADC architecture can also be chosen or selected for a given application and desired performance.

As previously illustrated in FIG. 3, the distributed ADC 300 can include a primary distributed ADC built from M primary building blocks, and each primary ADC slice within the primary building blocks can be implemented as a secondary distributed ADC. The secondary distributed ADC can be built from N secondary building blocks. The resulting distributed ADC 300 can include M×N (unit) ADC slices. The nested architecture can continue.

Figure 5:
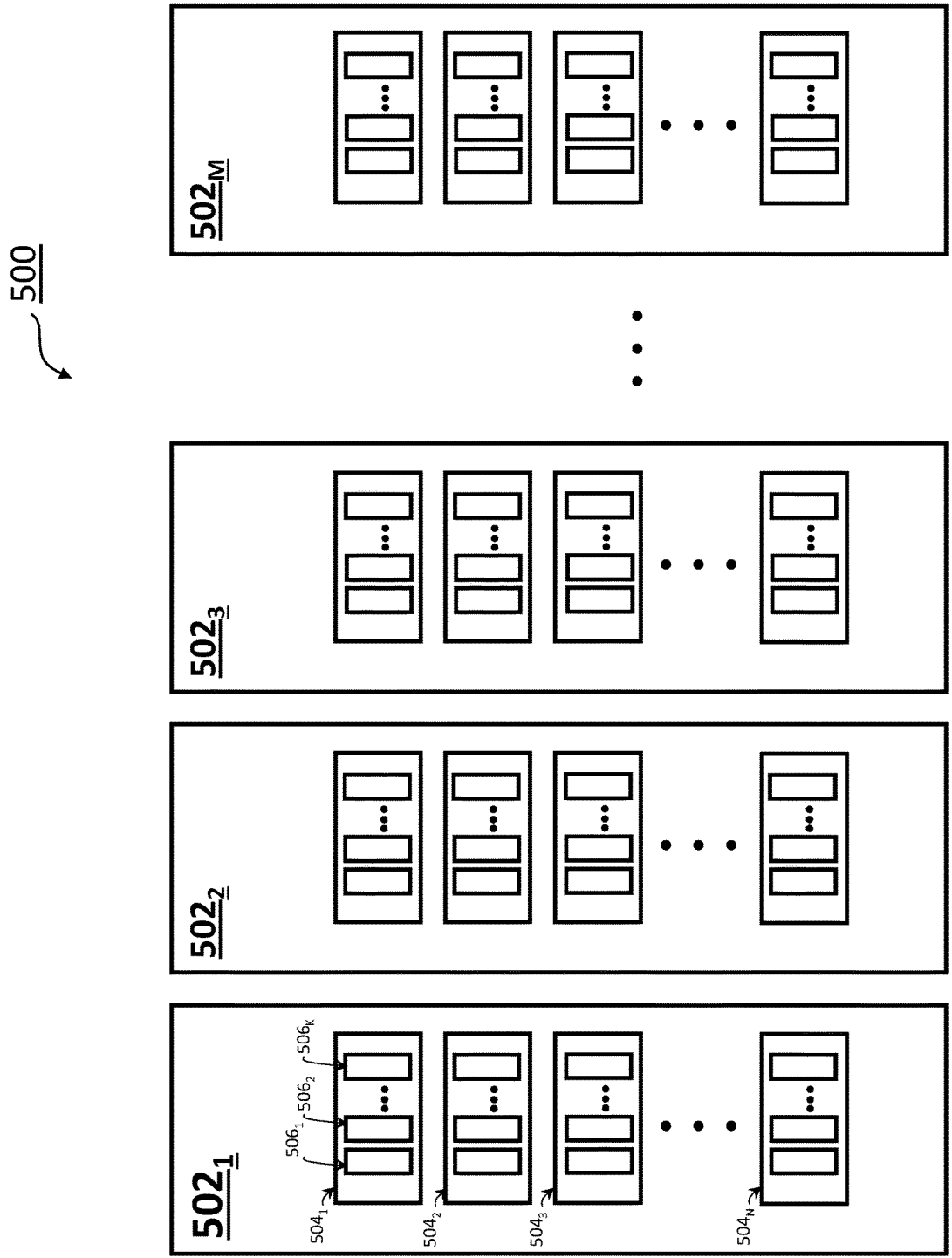
FIG. 5 illustrates the distributed ADC architecture having nested structure of building blocks, according to some embodiments of the disclosure.

FIG. 5 illustrates the distributed ADC architecture 500 having nested structure of building blocks, according to some embodiments of the disclosure.

At the outer most layer, the distributed ADC architecture 500 has M primary building blocks $502_1$, $502_2$, $502_3$, . . . $502_M$.

At the next layer, an ADC slice within any one of the primary building blocks $502_1$, $502_2$, $502_3$, . . . $502_M$, such as primary building block $502_1$, can be implemented as a distributed ADC having N secondary building blocks, such as N secondary building blocks $504_1$, $504_2$, $504_3$, . . . $504_N$.

At another layer, an ADC slice within any one of the secondary building blocks $504_1$, $504_2$, $504_3$, . . . $504_N$, such as secondary building block $504_1$, can be implemented as a distributed ADC having K tertiary building blocks, such as K tertiary building blocks $506_1$, $506_2$, . . . $506_N$.

At yet another layer, though not shown, an ADC slice within any one of the tertiary building blocks $506_1$, $506_2$, . . . $506_N$, can be implemented as a distributed ADC having L quaternary building blocks.

Exemplary Method for Driving a Distributed ADC

Figure 6:
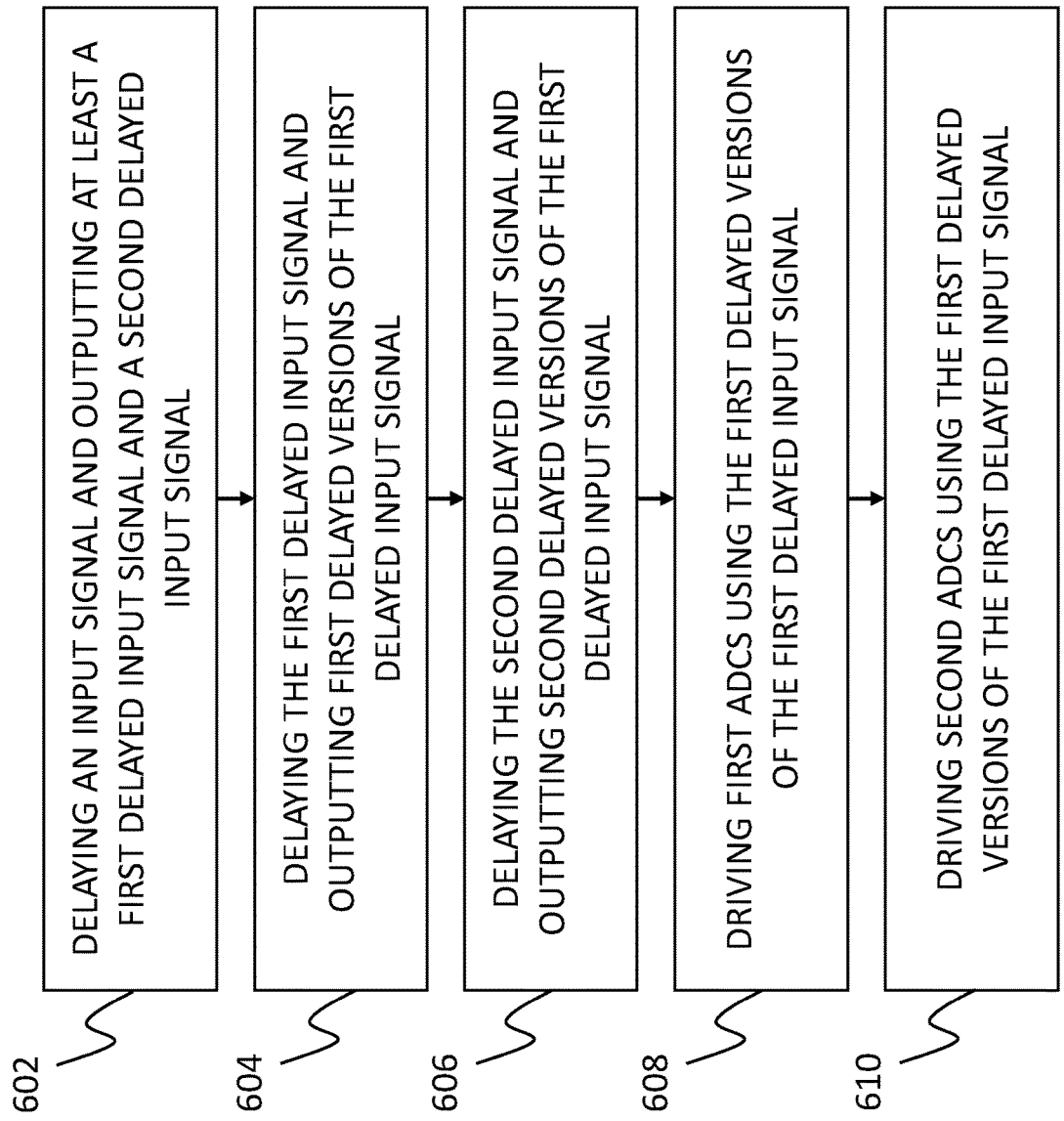
FIG. 6 is a flow diagram of a method for driving a distributed ADC, according to some embodiments of the disclosure.

FIG. 6 is a flow diagram of a method for driving a distributed ADC (e.g., any distributed ADC described herein), according to some embodiments of the disclosure. In 602, a primary input signal path delays an input signal, and outputs at least a first delayed input signal and a second delayed input signal. In 604, a first secondary input signal path delays the first delayed input signal, and outputs first delayed versions of the first delayed input signal. In 606, a second secondary input signal path delays the second delayed input signal, and outputs second delayed versions of the first delayed input signal. In 608, the first delayed versions of the first delayed input signal drive a plurality of first ADCs. In 610, the second delayed versions of the second delayed input signal drives a plurality of second ADCs.

EXAMPLES

Example 1 is a distributed analog to digital converter (ADC), comprising: a primary clock signal path to generate primary delayed versions of the clock signal; a primary input signal path to generate primary delayed versions of the input signal; and a plurality of primary ADCs driven by corresponding primary delayed versions of the clock signal and corresponding primary delayed versions of the input signal; wherein a first primary ADC, driven by a first primary delayed version of the clock signal and a first primary delayed version of the input signal, comprises: a secondary clock signal path to generate secondary delayed versions of the first primary delayed version of the clock signal; a secondary input signal path to generate secondary delayed versions of the first primary delayed version of the input signal; and a plurality of secondary ADCs driven by corresponding secondary delayed versions of the clock signal and corresponding secondary delayed versions of the input signal.

In Example 2, the distributed ADC of Example 1, can optionally include: a first secondary primary ADC, driven by a first secondary delayed version of the clock signal and a first secondary delayed version of the input signal, comprising: a tertiary clock signal path to generate tertiary delayed versions of the first secondary delayed version of the clock signal; a tertiary input signal path to generate tertiary delayed versions of the first secondary delayed version of the input signal; and a plurality of tertiary ADCs driven by corresponding tertiary delayed versions of the clock signal and corresponding tertiary delayed versions of the input signal.

In Example 3, the distributed ADC of Example 1 or 2 can optionally include: the primary clock signal path comprises serially-connected delay lines and nodes in between the serially-connected delay lines, wherein the nodes generate the primary delayed versions of the clock signal; and the primary input signal path comprises further serially-connected delay lines and further nodes in between the further serially-connected delay lines, wherein the further nodes generate the primary delayed versions of the clock signal.

In Example 4, the distributed ADC of any one of Examples 1-3 can optionally include: primary digital multiplexer circuitry to combine outputs of the primary ADCs.

In Example 5, the distributed ADC of any one of Examples 1-4 can optionally include a propagation direction of the primary clock signal path and a propagation direction of the primary input signal path being opposite of each other.

In Example 6, the distributed ADC of any one of Examples 1-3 can optionally include: primary digital summing circuitry to sum outputs of the primary ADCs.

In Example 7, the distributed ADC of any one of Examples 1-3 can optionally include primary digital summing circuitry to average outputs of the primary ADCs.

In Example 8, the distributed ADC of any one of Examples 1-3 or 6-7 can optionally include: a propagation direction of the primary clock signal path and a propagation direction of the primary input signal path being the same.

In Example 9, the distributed ADC of any one of Examples 1-8 can optionally include: secondary digital multiplexer circuitry to combine outputs of the secondary ADCs; wherein a propagation direction of the secondary clock signal path and a propagation direction of the secondary input signal path are opposite of each other.

In Example 10, the distributed ADC of any one of Examples 1-8 can optionally include: secondary digital summing circuitry to sum outputs of the secondary ADCs; wherein a propagation direction of the secondary clock signal path and a propagation direction of the secondary input signal path are the same.

Example 11 a delay circuit to drive a distributed analog to digital converter (ADC), comprising: primary serially-connected input signal delay lines to receive an input signal and output at least a first delayed input signal and a second delayed input signal; first secondary serially-connected input signal delay lines to receive the first delayed input signal and output first delayed versions of the first delayed input signal; and second secondary serially-connected input signal delay lines to receive the second delayed input signal and output second delayed versions of the first delayed input signal; wherein the first delayed versions of the first delayed input signal are provided to a plurality of first ADCs, and the second delayed versions of the second delayed input signal are provided to a plurality of second ADCs.

In Example 12, the delay circuit of Example 11 can optionally include respective delays of the primary serially-connected input signal delay lines being programmable.

In Example 13, the delay circuit of Example 11 or 12 can optionally include respective delays of the first serially-connected secondary input signal delay lines being programmable.

In Example 14, the delay circuit of any one of Examples 11-13 can optionally include: respective delays of the second serially-connected secondary input signal delay lines being programmable.

In Example 15, the delay circuit of any one of Examples 11-14 can optionally include the primary serially-connected input signal delay lines being programmable to implement a finite impulse response filter.

In Example 16, the delay circuit of any one of Examples 11-15 can optionally include: primary serially-connected clock signal delay lines to receive a clock signal and output at least a first delayed clock signal and a second delayed clock signal; first secondary serially-connected clock signal delay lines to receive a first delayed clock signal and output first delayed versions of the first delayed clock signal; and second secondary serially-connected clock signal delay lines to receive a second delayed clock signal and output second delayed versions of the first delayed clock signal; wherein the first delayed versions of the first delayed clock signal are provided to the first ADCs, and the second delayed versions of the second delayed clock signal are provided to the second ADCs.

In Example 17, the delay circuit of Example 16 can optionally include a propagation direction of the primary serially-connected input signal delay lines and a propagation direction of the primary serially-connected clock signal delay lines being opposite of each other.

In Example 18, the delay circuit of Example 16 can optionally include: a propagation direction of the primary serially-connected input signal delay lines and a propagation direction of the primary serially-connected clock signal delay lines being the same.

In Example 19, the delay circuit of any one of Examples 16-18 can optionally include a propagation direction of the first secondary serially-connected input signal delay lines and a propagation direction of the second secondary serially-connected clock signal delay lines being opposite of each other.

In Example 20, the delay circuit of any one of Examples 16-18 can optionally include a propagation direction of the first secondary serially-connected input signal delay lines and a propagation direction of the second secondary serially-connected clock signal delay lines being the same.

In Example 21, the delay circuit of any one of Examples 11-20 can optionally include the primary serially-connected input signal delay lines comprising transmission lines.

In Example 22, the delay circuit of any one of Examples 11-21 can optionally include the primary serially-connected input signal delay lines comprising cascaded resistor-capacitor lattices.

In Example 23, the delay circuit of any one of Examples 11-22 can optionally include the primary serially-connected input signal delay lines comprising cascaded inductor-capacitor lattices.

Example 24 is a method for driving a distributed analog to digital converter (ADC), the method comprising: delaying, by a primary input signal path, an input signal, and outputting at least a first delayed input signal and a second delayed input signal; delaying, by a first secondary input signal path, the first delayed input signal, and outputting first delayed versions of the first delayed input signal; delaying, by a second secondary input signal path, the second delayed input signal, and outputting second delayed versions of the first delayed input signal; driving a plurality of first ADCs using the first delayed versions of the first delayed input signal; and driving a plurality of second ADCs using the second delayed versions of the second delayed input signal.

In Example 25, the method of Example 24 can optionally include: delaying, by a primary clock signal path, a clock signal, and outputting at least a first delayed clock signal and a second delayed clock signal; delaying, by a first secondary clock signal path, the first delayed clock signal, and outputting first delayed versions of the first delayed clock signal; delaying, by a second secondary clock signal path, the second delayed clock signal, and outputting second delayed versions of the first delayed clock signal; clocking the first ADCs using the first delayed versions of the first delayed clock signal; and clocking the second ADCs using the second delayed versions of the second delayed clock signal.

In Example 26, the method of Example 24 or 25 can optionally include: multiplexing digital outputs of the first ADCs to generate a first digital output; and multiplexing digital outputs of the second ADCs to generate a second digital output.

In Example 27, the method of Example 26 can optionally include summing the first digital output and the second digital output.

Example A is an apparatus comprising means to implement any one of the methods illustrated herein.

Other Implementation Notes, Variations, and Applications

The architectures described herein are particularly suitable for high speed, high precision applications. Applications which can greatly benefit from the architecture include: instrumentation, testing, spectral analyzers, military purposes, radar, wired or wireless communications, mobile telephones (especially because standards continue to push for higher speed communications), and base stations.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions carried out by the disclosed embodiments, illustrate only some of the possible functions that may be implemented by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A distributed analog to digital converter (ADC), comprising:
   a primary clock signal path to generate primary delayed versions of a clock signal;
   a primary input signal path to generate primary delayed versions of a input signal; and
   a plurality of primary ADCs driven by corresponding primary delayed versions of the clock signal and corresponding primary delayed versions of the input signal;
   wherein a first primary ADC, driven by a first primary delayed version of the clock signal and a first primary delayed version of the input signal, comprises:
      a secondary clock signal path to generate secondary delayed versions of the first primary delayed version of the clock signal;
      a secondary input signal path to generate secondary delayed versions of the first primary delayed version of the input signal; and
      a plurality of secondary ADCs driven by corresponding secondary delayed versions of the clock signal and corresponding secondary delayed versions of the input signal.

2. The distributed ADC of claim 1, wherein a first secondary primary ADC, driven by a first secondary delayed version of the clock signal and a first secondary delayed version of the input signal, comprises:
   a tertiary clock signal path to generate tertiary delayed versions of the first secondary delayed version of the clock signal;
   a tertiary input signal path to generate tertiary delayed versions of the first secondary delayed version of the input signal; and
   a plurality of tertiary ADCs driven by corresponding tertiary delayed versions of the clock signal and corresponding tertiary delayed versions of the input signal.

3. The distributed ADC of claim 1, wherein:
   the primary clock signal path comprises serially-connected delay lines and nodes in between the serially-connected delay lines, wherein the nodes generate the primary delayed versions of the clock signal; and
   the primary input signal path comprises further serially-connected delay lines and further nodes in between the further serially-connected delay lines, wherein the further nodes generate the primary delayed versions of the clock signal.

4. The distributed ADC of claim 1, further comprising:
   primary digital multiplexer circuitry to combine outputs of the primary ADCs.

5. The distributed ADC of claim 1, wherein:
   a propagation direction of the primary clock signal path and a propagation direction of the primary input signal path are opposite of each other.

6. The distributed ADC of claim 1, further comprising:
   primary digital summing circuitry to sum outputs of the primary ADCs.

7. The distributed ADC of claim 1, further comprising:
   primary digital summing circuitry to average outputs of the primary ADCs.

8. The distributed ADC of claim 1, wherein:
   a propagation direction of the primary clock signal path and a propagation direction of the primary input signal path are the same.

9. The distributed ADC of claim 1, further comprising:
   secondary digital multiplexer circuitry to combine outputs of the secondary ADCs;
   wherein a propagation direction of the secondary clock signal path and a propagation direction of the secondary input signal path are opposite of each other.

10. The distributed ADC of claim 1, further comprising:
    secondary digital summing circuitry to sum outputs of the secondary ADCs;
    wherein a propagation direction of the secondary clock signal path and a propagation direction of the secondary input signal path are the same.

11. A delay circuit to drive a distributed analog to digital converter (ADC), comprising:
    primary serially-connected input signal delay lines to receive an input signal and output at least a first delayed input signal and a second delayed input signal;
    first secondary serially-connected input signal delay lines to receive the first delayed input signal and output first delayed versions of the first delayed input signal; and
    second secondary serially-connected input signal delay lines to receive the second delayed input signal and output second delayed versions of the first delayed input signal;
    wherein the first delayed versions of the first delayed input signal are provided to a plurality of first ADCs, and the second delayed versions of the second delayed input signal are provided to a plurality of second ADCs.

12. The delay circuit of claim 11, wherein respective delays of the primary serially-connected input signal delay lines are programmable.

13. The delay circuit of claim 11, wherein respective delays of the first secondary serially-connected input signal delay lines are programmable.

14. The delay circuit of claim 11, wherein the primary serially-connected input signal delay lines are programmable to implement a finite impulse response filter.

15. The delay circuit of claim 11, further comprising:
primary serially-connected clock signal delay lines to receive a clock signal and output at least a first delayed clock signal and a second delayed clock signal;
first secondary serially-connected clock signal delay lines to receive a first delayed clock signal and output first delayed versions of the first delayed clock signal; and
second secondary serially-connected clock signal delay lines to receive a second delayed clock signal and output second delayed versions of the first delayed clock signal;
wherein the first delayed versions of the first delayed clock signal are provided to the first ADCs, and the second delayed versions of the second delayed clock signal are provided to the second ADCs.

16. The delay circuit of claim 15, wherein:
a propagation direction of the primary serially-connected input signal delay lines and a propagation direction of the primary serially-connected clock signal delay lines are opposite of each other.

17. The delay circuit of claim 15, wherein:
a propagation direction of the primary serially-connected input signal delay lines and a propagation direction of the primary serially-connected clock signal delay lines are the same.

18. The delay circuit of claim 15, wherein:
a propagation direction of the first secondary serially-connected input signal delay lines and a propagation direction of the second secondary serially-connected clock signal delay lines are opposite of each other.

19. The delay circuit of claim 15, wherein:
a propagation direction of the first secondary serially-connected input signal delay lines and a propagation direction of the second secondary serially-connected clock signal delay lines are the same.

20. The delay circuit of claim 11, wherein respective delays of the second secondary serially-connected input signal delay lines are programmable.

21. The delay circuit of claim 11, wherein the primary serially-connected input signal delay lines comprise transmission lines.

22. The delay circuit of claim 11, wherein the primary serially-connected input signal delay lines comprise cascaded resistor-capacitor lattices.

23. The delay circuit of claim 11, wherein the primary serially-connected input signal delay lines comprise cascaded inductor-capacitor lattices.

24. A method for driving a distributed analog to digital converter (ADC), the method comprising:
delaying, by a primary input signal path, an input signal, and outputting at least a first delayed input signal and a second delayed input signal;
delaying, by a first secondary input signal path, the first delayed input signal, and outputting first delayed versions of the first delayed input signal;
delaying, by a second secondary input signal path, the second delayed input signal, and outputting second delayed versions of the first delayed input signal;
driving a plurality of first ADCs using the first delayed versions of the first delayed input signal; and
driving a plurality of second ADCs using the second delayed versions of the second delayed input signal.

25. The method of claim 24, further comprising:
delaying, by a primary clock signal path, a clock signal, and outputting at least a first delayed clock signal and a second delayed clock signal;
delaying, by a first secondary clock signal path, the first delayed clock signal, and outputting first delayed versions of the first delayed clock signal;
delaying, by a second secondary clock signal path, the second delayed clock signal, and outputting second delayed versions of the first delayed clock signal;
clocking the first ADCs using the first delayed versions of the first delayed clock signal; and
clocking the second ADCs using the second delayed versions of the second delayed clock signal.

26. The method of claim 24, further comprising:
multiplexing digital outputs of the first ADCs to generate a first digital output; and
multiplexing digital outputs of the second ADCs to generate a second digital output.

27. The method of claim 26, further comprising:
summing the first digital output and the second digital output.

* * * * *